US012148737B2

(12) United States Patent
Mikami

(10) Patent No.: US 12,148,737 B2
(45) Date of Patent: Nov. 19, 2024

(54) SEMICONDUCTOR DEVICE

(71) Applicant: Mitsubishi Electric Corporation, Tokyo (JP)

(72) Inventor: Kazuto Mikami, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 298 days.

(21) Appl. No.: 17/569,618

(22) Filed: Jan. 6, 2022

(65) Prior Publication Data

US 2022/0302091 A1 Sep. 22, 2022

(30) Foreign Application Priority Data

Mar. 17, 2021 (JP) ................... 2021-043569

(51) Int. Cl.
*H01L 25/07* (2006.01)
*H01L 23/00* (2006.01)
(Continued)

(52) U.S. Cl.
CPC .......... *H01L 25/072* (2013.01); *H01L 23/492* (2013.01); *H01L 24/48* (2013.01);
(Continued)

(58) Field of Classification Search
None
See application file for complete search history.

(56) References Cited

U.S. PATENT DOCUMENTS

| 2002/0008319 A1* | 1/2002 | Davis | ...................... | H01L 24/49 |
| | | | | 257/E23.044 |
| 2005/0231990 A1 | 10/2005 | Uno et al. | | |

(Continued)

FOREIGN PATENT DOCUMENTS

| JP | 2005-310907 A | 11/2005 |
| JP | 2010-232576 A | 10/2010 |

(Continued)

OTHER PUBLICATIONS

An Office Action; "Notice of Reasons for Refusal," mailed by the Japanese Patent Office on Jan. 30, 2024, which corresponds to Japanese Patent Application No. 2021-043569 and is related to U.S. Appl. No. 17/569,618; with English language translation.

*Primary Examiner* — Michelle Mandala
*Assistant Examiner* — Jordan M Klein
(74) *Attorney, Agent, or Firm* — Studebaker & Brackett PC

(57) ABSTRACT

An object of the present disclosure is to facilitate thermal design in a semiconductor device in which MOSFETs and SBDs are connected in antiparallel. The semiconductor device includes a MOSFET chip provided on a first pattern, whose drain electrode and source electrode are electrically connected to the first pattern and a second pattern, respectively, an SBD chip provided on a third pattern, whose cathode electrode and anode electrode are electrically connected to the third pattern and fourth pattern, respectively, a drain main terminal connected to the first pattern, a source main terminal connected to the second pattern, a cathode main terminal connected to the third pattern, and an anode main terminal connected to the fourth pattern. At least one of between the drain main terminal and the cathode main terminal and between the source main terminal and the anode main terminal is not electrically connected.

12 Claims, 17 Drawing Sheets

(51) Int. Cl.
*H01L 23/492* (2006.01)
*H01L 25/18* (2023.01)

(52) U.S. Cl.
CPC .... *H01L 25/18* (2013.01); *H01L 2224/48137* (2013.01); *H01L 2224/48175* (2013.01); *H01L 2924/12032* (2013.01); *H01L 2924/13091* (2013.01); *H01L 2924/30107* (2013.01)

(56) References Cited

U.S. PATENT DOCUMENTS

| | | | |
|---|---|---|---|
| 2010/0244092 A1* | 9/2010 | Ishikawa | H01L 29/1608 |
| | | | 257/140 |
| 2011/0062491 A1* | 3/2011 | Nakata | H01L 25/072 |
| | | | 257/146 |
| 2012/0013261 A1* | 1/2012 | Xu | H05B 45/35 |
| | | | 315/186 |
| 2012/0286292 A1 | 11/2012 | Nakayama et al. | |
| 2013/0214328 A1 | 8/2013 | Ishikawa et al. | |
| 2014/0138707 A1 | 5/2014 | Miki et al. | |
| 2014/0374794 A1 | 12/2014 | Ishikawa et al. | |

FOREIGN PATENT DOCUMENTS

| | | |
|---|---|---|
| JP | 2016-167635 A | 9/2016 |
| WO | 2010/004802 A1 | 1/2010 |
| WO | 2011/086896 A1 | 7/2011 |

* cited by examiner

F I G. 4
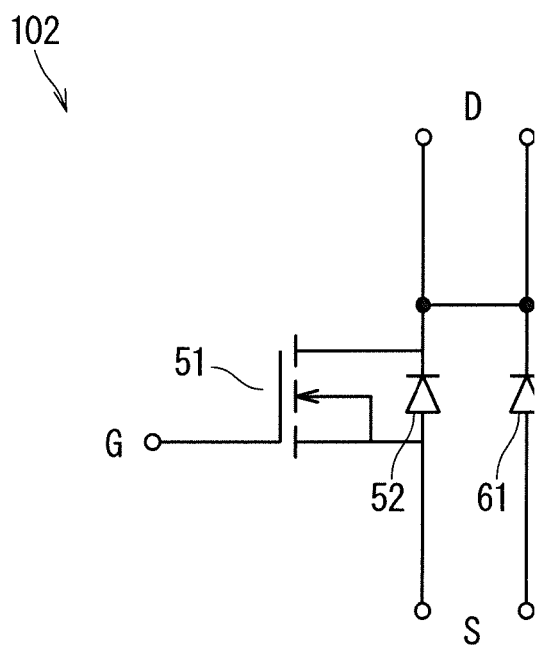

SEMICONDUCTOR DEVICE

BACKGROUND OF THE INVENTION

Field of the Invention

The present disclosure relates to a semiconductor device.

Description of the Background Art

Japanese Patent Application Laid-Open No. 2005-310907 discloses semiconductor device including Metal-Oxide-Semiconductor Field Effect Transistors (MOSFET) and Schottky Barrier Diodes (SBD) connected in antiparallel to the MOSFETs, in which the GNDs are used for the MOSFETs and the SBDs in a separate manner. According to the configuration of the semiconductor device, the forward voltage Vf can be measured individually for the MOSFETs and the SBDs, and the thermal resistances of the MOSFETs and the SBDs can be measured individually from the temperature dependence of the respective forward voltage Vf.

SUMMARY

In the semiconductor device of Japanese Patent Application Laid-Open No. 2005-310907, the MOSFET chips and the SBD chips are mounted on the same die pad, greatly affecting the thermal interference between the both types of chips. Therefore, a difference in the values of thermal resistances is caused between the case where the thermal resistances are measured under the actual use where the both types of chips generate heat under various conditions and the case where the thermal resistances are measured for individual types of chips, and this has been the problem that has made thermal design difficult.

The present disclosure has been made to solve the above-mentioned problem, and an object of the present disclosure is to facilitate thermal design in a semiconductor device including the MOSFETs and the SBDs.

The semiconductor device of the present disclosure includes a base plate, at least one insulating substrate, a first pattern, a second pattern, a third pattern, and a fourth pattern, a MOSFET chip, an SBD chip, a drain terminal, a source terminal, a cathode terminal, and an anode terminal. The at least one insulating substrate is provided on the base plate. The first pattern, the second pattern, the third pattern, and the fourth pattern are provided apart from each other on the at least one insulating substrate. The MOSFET chip is provided on the first pattern and a drain electrode and a source electrode thereof are electrically connected to the first pattern and the second pattern, respectively. The SBD chip is provided on the third pattern and a cathode electrode and an anode electrode thereof are electrically connected to the third pattern and the fourth pattern, respectively. A drain terminal is connected to the first pattern. A source terminal is connected to the second pattern. A cathode terminal is connected to the third pattern. An anode terminal is connected to the fourth pattern. At least one of between the drain terminal and the cathode terminal and between the source terminal and the anode terminal is not electrically connected.

According to the semiconductor device of the present disclosure, the MOSFET chip and the SBD chip are provided on different conductive patterns; therefore, thermal interference between the MOSFET chip and the SBD chip is suppressed. As a result, the thermal resistance in actual use in which both chips generate heat can be brought close to the thermal resistance measured for individual chips, making the thermal design facilitated.

These and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 4 is an equivalent circuit diagram of the semiconductor device;

DESCRIPTION OF THE PREFERRED EMBODIMENTS

A. Embodiment 1

<A-1. Configuration>

Figure 1:
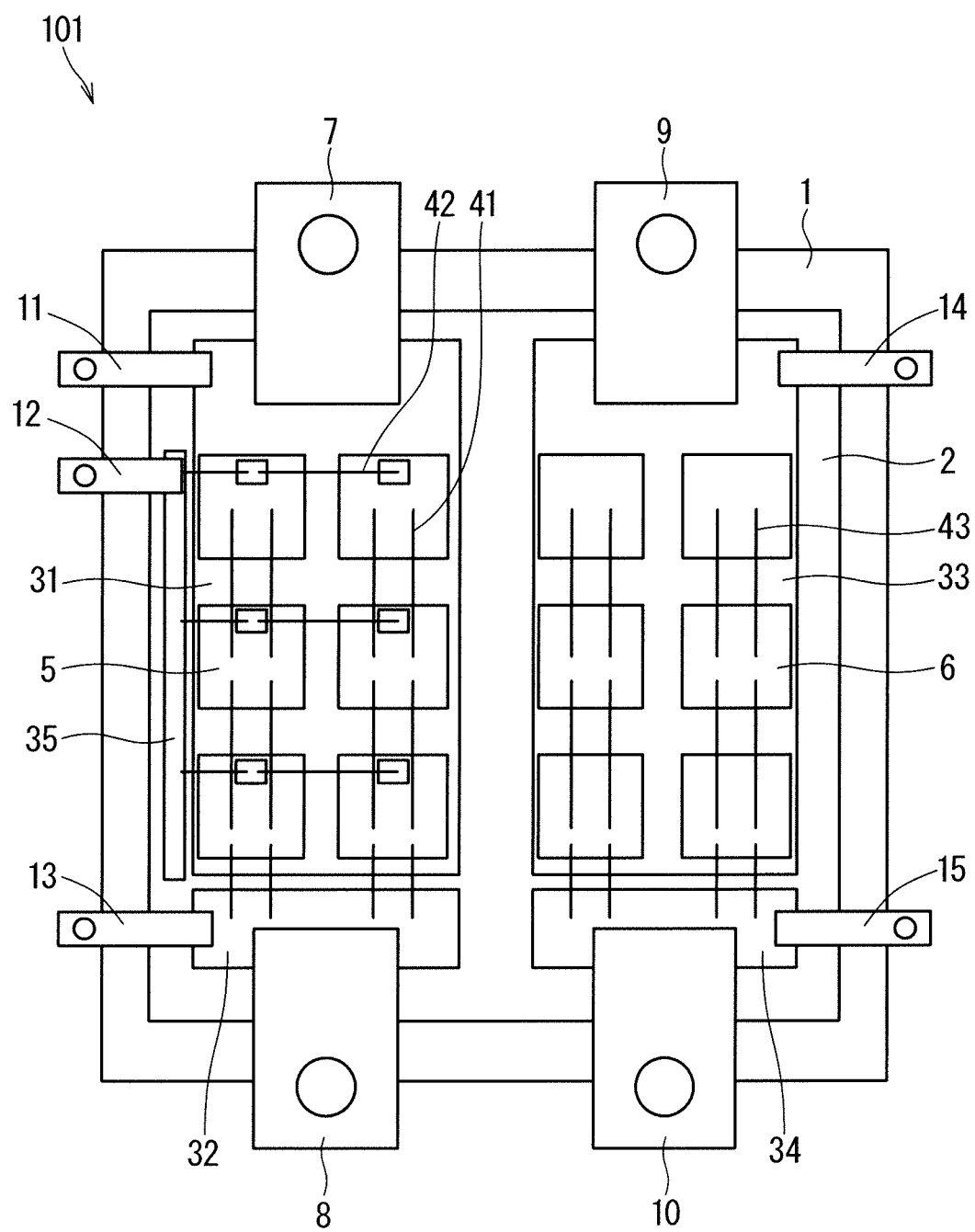
FIG. 1 is a plan view of the semiconductor device of Embodiment 1.

FIG. 1 is a plan view of a semiconductor device 101 of Embodiment 1. The semiconductor device 101 includes a base plate 1, an insulating substrate 2, patterns 31, 32, 33, 34, and 35 being conductive patterns, a plurality of MOSFET chips 5, a plurality of SBD chips 6, a drain main terminal 7, a source main terminal 8, a cathode main terminal 9, an anode main terminal 10, a drain auxiliary terminal 11, a gate auxiliary terminal 12, a source auxiliary terminal 13, a cathode auxiliary terminal 14, and an anode auxiliary terminal 15.

The insulating substrate 2 is mounted on the base plate 1. The patterns 31, 32, 33, 34, and 35 are formed on the insulating substrate 2.

The plurality of MOSFET chips 5 are mounted on the pattern 31. Each MOSFET chip 5 has a drain electrode on the lower surface thereof and a source electrode and a gate electrode on the upper surface thereof. Therefore, by mounting each MOSFET chip 5 on the pattern 31, the drain electrode of each MOSFET chip 5 is electrically connected to the pattern 31. That is, the pattern 31 is a drain conductive pattern having the same potential as that of the drain electrode. The pattern 31 is also referred to as the first pattern. The pattern 31 is connected to the drain main terminal 7 and the drain auxiliary terminal 11. The drain main terminal 7 is an external connection terminal for connecting the drain electrode of each MOSFET chip 5 to the outside of the semiconductor device 101.

The source electrodes on the top surfaces of respective MOSFET chips 5 are connected to each other by conductive wires 41 and further connected to the pattern 32. That is, the pattern 32 is a source conductive pattern having the same potential as that of the source electrode. The pattern 32 is also referred to as the second pattern. The pattern 32 is connected to the source main terminal 8 and the source auxiliary terminal 13. The source main terminal 8 is an external connection terminal for connecting the source electrode of each MOSFET chip 5 to the outside of the semiconductor device 101.

The gate electrodes on the top surfaces of respective MOSFET chips 5 are connected to each other by conductive wires 42 and further connected to the pattern 35. That is, the pattern 35 is a gate conductive pattern having the same potential as that of the gate electrode. The pattern 35 is connected to the gate auxiliary terminal 12.

The plurality of SBD chips 6 are mounted on the pattern 33. Each SBD chip 6 has a cathode electrode on the lower surface thereof and an anode electrode on the upper surface thereof. Therefore, by mounting each SBD chip 6 on the pattern 33, the cathode electrode of each SBD chip 6 is electrically connected to the pattern 33. That is, the pattern 33 is a cathode conductive pattern having the same potential as that of the cathode electrode. The pattern 33 is also referred to as the third pattern. The pattern 33 is connected to the cathode main terminal 9 and the cathode auxiliary terminal 14. The cathode main terminal 9 is an external connection terminal for connecting the cathode electrode of each SBD chip 6 to the outside of the semiconductor device 101.

The anode electrodes on the top surfaces of respective SBD chips 6 are connected to each other by conductive wires 43 and further connected to the pattern 34. That is, the pattern 34 is an anode conductive pattern having the same potential as that of the anode electrode. The pattern 34 is also referred to as the fourth pattern. The pattern 34 is connected to the anode main terminal 10 and the anode auxiliary terminal 15. The anode main terminal 10 is an external connection terminal for connecting the anode electrode of each SBD chip 6 to the outside of the semiconductor device 101.

The drain main terminal 7 and the cathode main terminal 9 are not directly connected to each other. Further, the drain main terminal 7 is connected to the pattern 31 different from the pattern 33 to which the cathode main terminal 9 is connected, and both patterns 31 and 33 are insulated from each other by the insulating substrate 2. Therefore, the drain main terminal 7 and the cathode main terminal 9 are not directly connected to each other.

Similarly, the source main terminal 8 and the anode main terminal 10 are not directly connected to each other. Further, the source main terminal 8 is connected to the pattern 32 different from the pattern 34 to which the anode main terminal 10 is connected, and both patterns 32 and 34 are insulated from each other by the insulating substrate 2. Therefore, the source main terminal 8 and the anode main terminal 10 are not directly connected to each other.

Figure 2:
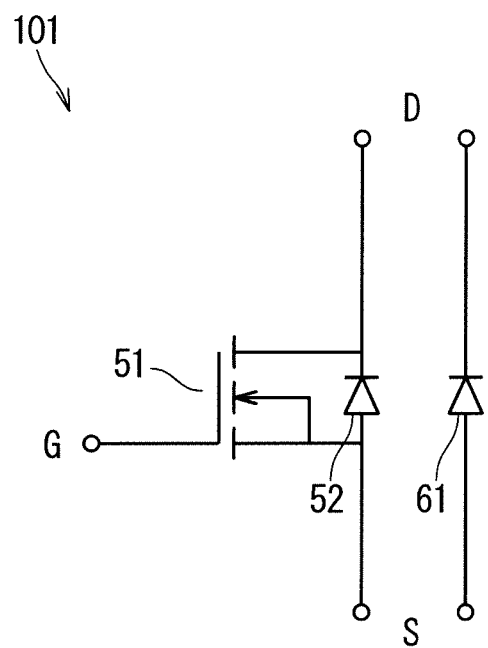
FIG. 2 is an equivalent circuit diagram of the semiconductor device.

FIG. 2 is an equivalent circuit diagram of the semiconductor device 101. The plurality of MOSFET chips 5 correspond to a MOSFET 51 and a body diode 52 connected between the source and drain of the MOSFET 51. Also, the plurality of SBD chips 6 correspond to an SBD 61. The drain electrode of the MOSFET 51 is not electrically connected to the cathode electrode of the SBD 61. Also, the source electrode of the MOSFET 51 is not electrically connected to the anode electrode of the SBD 61.

<A-2. Effect>

In the semiconductor device 101 of Embodiment 1, the drain main terminal 7 and the cathode main terminal 9 are not electrically connected, and the source main terminal 8 and the anode main terminal 10 are not electrically connected. Therefore, the forward voltage Vf of the body diode 52 of the MOSFET 51 and the forward voltage Vf of the SBD 61 can be measured individually. Therefore, the thermal resistance measurement of the MOSFET 51 and the SBD 61 can be accurately performed using the temperature dependencies of these forward voltages Vf.

In particular, when the MOSFET is a SiC-MOSFET that uses SiC as a semiconductor material, the accurate thermal resistance measurement is performed only by the thermal resistance measurement using the body diode because the SiC-MOSFET has complicated temperature characteristics. Therefore, the structure of the semiconductor device 101 is useful for enabling thermal resistance measurement with actually usable elements.

In the semiconductor device 101, the plurality of MOSFET chips 5 are mounted on the patterns 31 and 32, and the plurality of SBD chips 6 are mounted on the patterns 33 and 34. By mounting the plurality of MOSFET chips 5 and the plurality of SBD chips 6 on the different patterns in this manner, thermal interference between the plurality of MOSFET chips 5 and the plurality of SBD chips 6 is suppressed. Therefore, the difference in thermal resistance values is reduced between the case where the thermal resistances are measured under the actual use where the plurality of MOSFET chips 5 and the plurality of SBD chips 6 generate heat under their respective operating conditions and the case where the thermal resistances are measured for the individual chips, leading to facilitated thermal design.

As illustrated in FIG. 1, it is desirable that the patterns 31 and 32 on which the plurality of MOSFET chips 5 are mounted and the patterns 33 and 34 on which the plurality of SBD chips 6 are mounted have substantially the same shape. Specifically, it is desirable that the pattern 31 has substantially the same shape as the pattern 33, and the pattern 32 has substantially the same shape as the pattern 34. As a result, the heat capacity from each MOSFET chip 5 to the base plate 1 and the heat capacity from each SBD chip 6 to the base plate 1 become almost equal and this makes the design using the transient thermal resistance facilitated.

<A-3. Modification>

In order to measure the forward voltage Vf of the body diode 52 of the MOSFET 51 and the forward voltage Vf of the SBD 61 individually, it is sufficient that at least one of between the drain main terminal 7 and the cathode main terminal 9 and between the source main terminal 8 and the anode main terminal 10 is not electrically connected. Therefore, the drain main terminal 7 and the cathode main terminal 9 may be connected to each other by being configured by a common terminal 16 as in a semiconductor device 102 of Modification 1 of Embodiment 1 illustrated in the plan view in FIG. 3. The common terminal 16 is also referred to as a first common terminal. The common terminal 16 includes a first member 161 drawn linearly from the pattern 31 being the drain conductive pattern in a direction perpendicular to an end edge of the base plate 1, a second member 162 drawn linearly from the pattern 33, being the cathode conductive pattern in the direction perpendicular to the end edge of the base plate 1, and a third member 163 connecting the first member 161 and the second member 162. The first member 161 is a current path from the external configuration of the semiconductor device connected to the common terminal 16 to the pattern 31, and constitutes the drain main terminal 7. Further, the second member 162 is a current path from the external configuration of the semiconductor device connected to the common terminal 16 to the pattern 33, and constitutes the cathode main terminal 9. FIG. 4 is an equivalent circuit diagram of the semiconductor device 102. In FIG. 4, the source terminal of the MOSFET 51 and the anode terminal of the SBD 61 are not electrically connected, but the drain terminal of the MOSFET 51 and the anode terminal of the SBD 61 are electrically connected.

Figure 5:
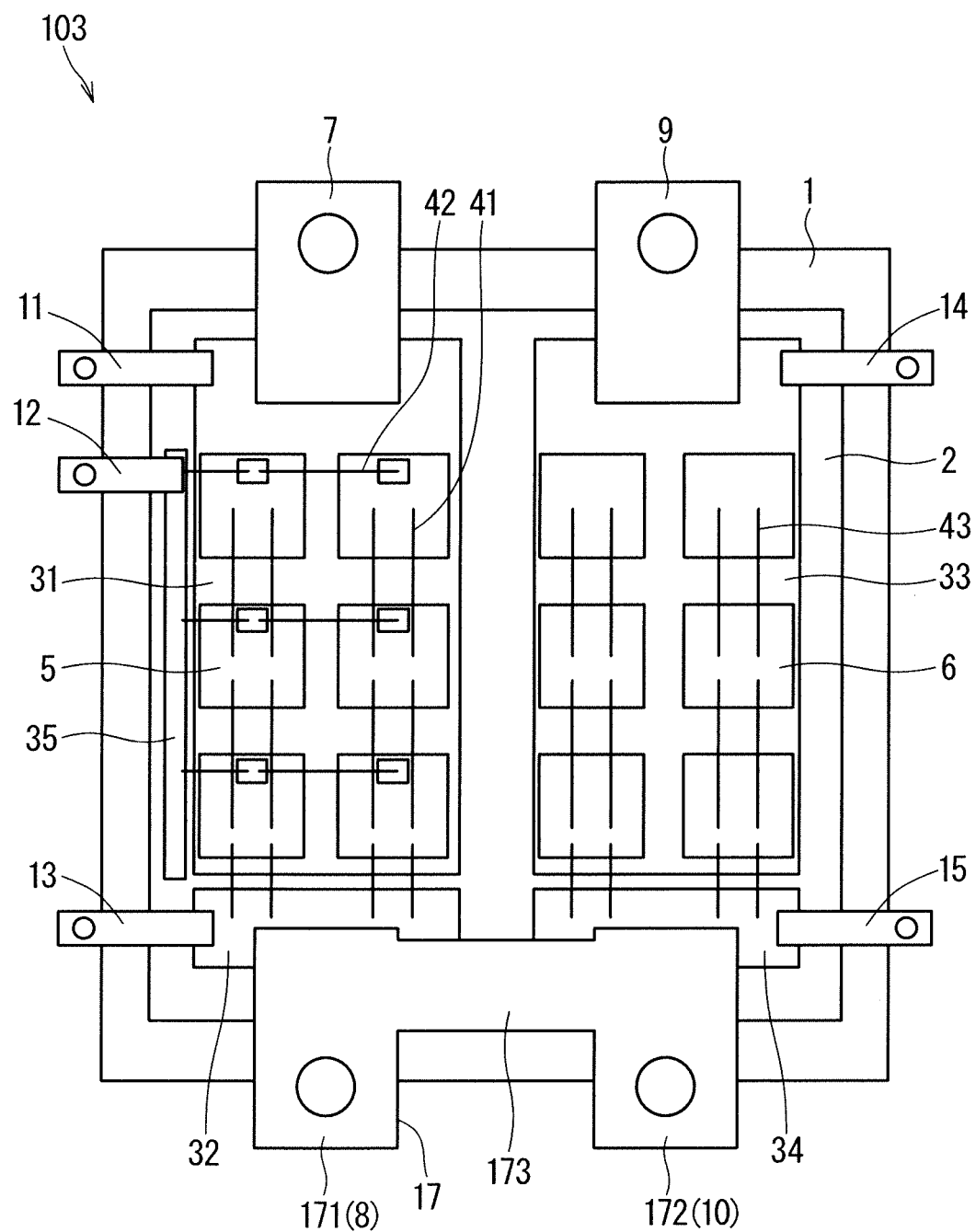
FIG. 5 is a plan view of a semiconductor device of Modification 2 of Embodiment 1.
Figure 6:
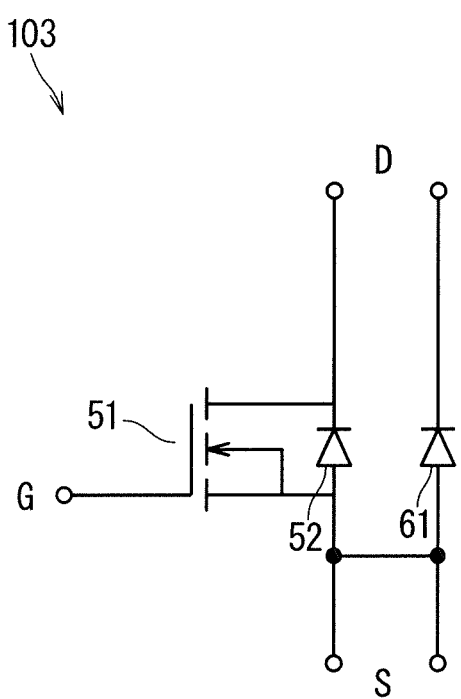
FIG. 6 is an equivalent circuit diagram of the semiconductor device.

Further, the source main terminal 8 and the anode main terminal 10 may be connected to each other by being configured by the common terminal 17 as in the semiconductor device 103 of Modification 2 of Embodiment 1 illustrated in the plan view in FIG. 5. The common terminal 17 is also referred to as a second common terminal. The common terminal 17 includes a first member 171 drawn linearly from the pattern 32 being the source conductive pattern in a direction perpendicular to an end edge of the base plate 1, a second member 172 drawn linearly from the pattern 34, being the anode conductive pattern in the direction perpendicular to the end edge of the base plate 1, and a third member 173 connecting the first member 171 and the second member 172. Further, the first member 171 is a current path from the external configuration of the semiconductor device connected to the common terminal 17 to the pattern 32, and constitutes the source main terminal 8. Further, the second member 172 is a current path from the external configuration of the semiconductor device connected to the common terminal 17 to the pattern 34, and constitutes the anode main terminal 10. FIG. 6 is an equivalent circuit diagram of the semiconductor device 103. In FIG. 6, the drain terminal of the MOSFET 51 and the cathode terminal of the SBD 61 are not electrically connected, but the source terminal of the MOSFET 51 and the anode terminal of the SBD 61 are electrically connected.

Figure 3:
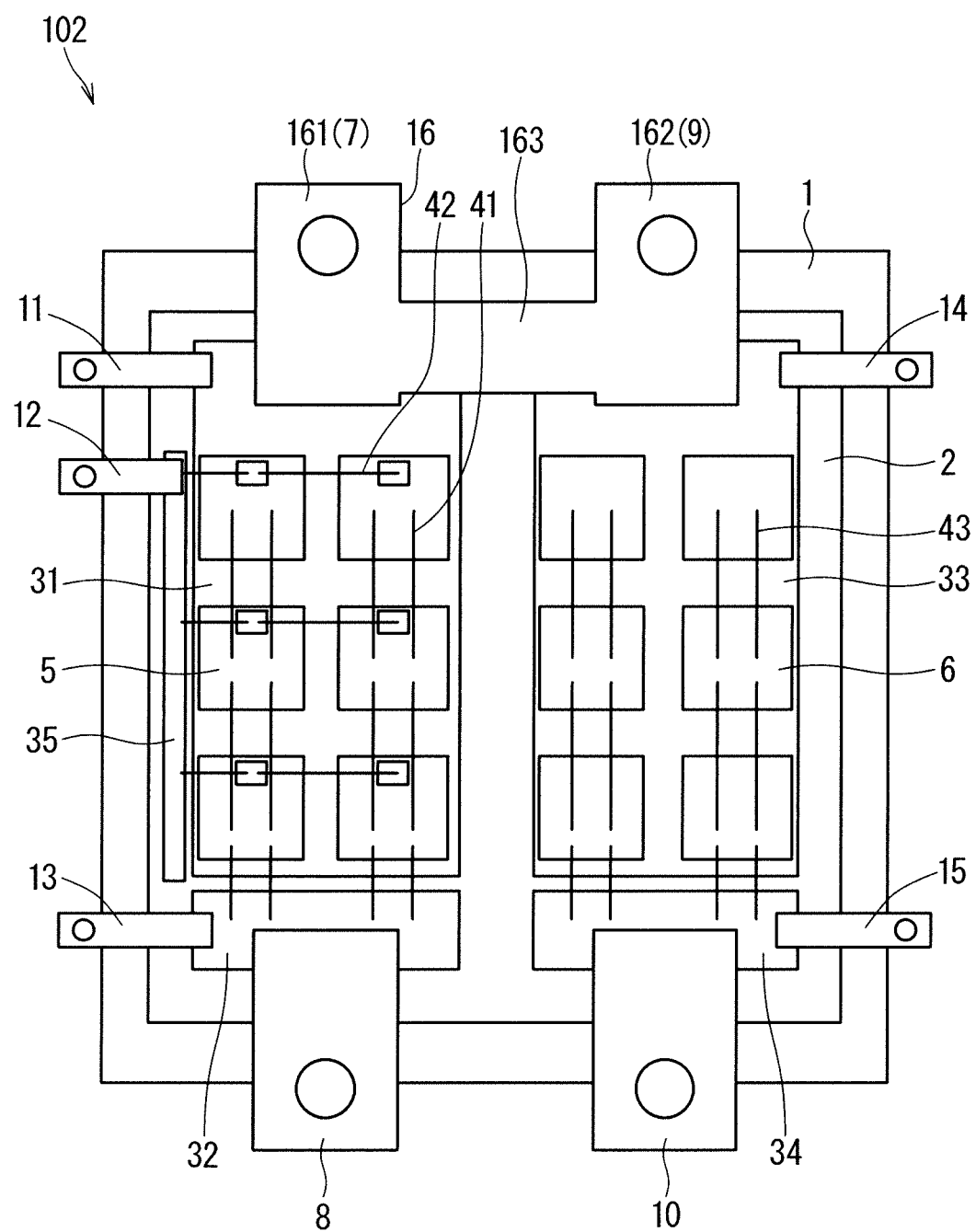
FIG. 3 is a plan view of a semiconductor device of Modification 1 of Embodiment 1.

FIG. 3 illustrates the example in which the drain main terminal 7 and the cathode main terminal 9 are connected by being configured by the common terminal 16. Instead of this, a configuration may be adopted in which the pattern 31 being the drain conductive pattern and the pattern 33 being the cathode conductive pattern are connected by a bus bar, so that the drain main terminal 7 and the cathode main terminal 9 are electrically connected. Also in FIG. 5, the example is illustrated in which the source main terminal 8 and the anode main terminal 10 are connected by being configured by the common terminal 17. Instead of this, a configuration may be adopted in which the pattern 32 being the source conductive pattern and the pattern 34 being the anode conductive pattern are connected by a bus bar, so that the source main terminal 8 and the anode main terminal 10 are electrically connected.

B. Embodiment 2

<B-1. Configuration>

Figure 7:
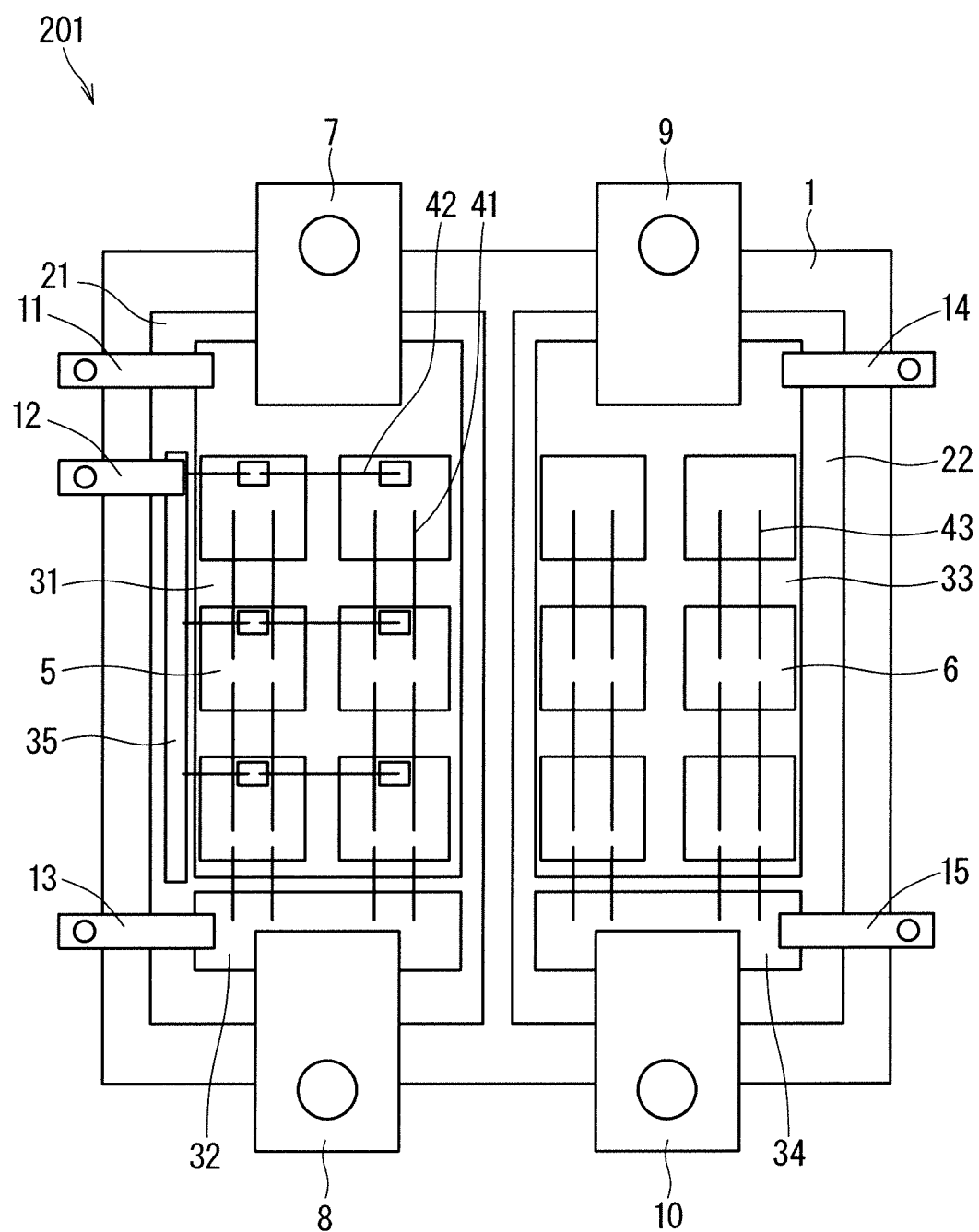
FIG. 7 is a plan view of a semiconductor device of Embodiment 2.

FIG. 7 is a plan view of a semiconductor device 201 of Embodiment 2. In the semiconductor device 101 of Embodiment 1, the patterns 31 and 32 on which the plurality of MOSFET chips 5 are mounted and the patterns 33 and 34 on which the plurality of SBD chips 6 are mounted are provided on the same insulating substrate 2. Whereas, in the semiconductor device 201 of Embodiment 2, the patterns 31 and 32 on which the plurality of MOSFET chips 5 are mounted and the patterns 33 and 34 on which the plurality of SBD chips 6 are mounted are provided on different insulating substrates 21 and 22, respectively. That is, the insulating substrates 21 and 22 are mounted on the base plate 1 in the semiconductor device 201. And, the patterns 31 and 32 are formed on the insulating substrate 21, and the patterns 33 and 34 are formed on the insulating substrate 22. The configuration of semiconductor device 201 other than the above is the same as the semiconductor device 101.

An equivalent circuit diagram of the semiconductor device 201 is the same as the equivalent circuit diagram of the semiconductor device 101 illustrated in FIG. 2.

<B-2. Effects>

According to the semiconductor device 201, the following effects can be obtained in addition to the effects of the semiconductor device 101. In the semiconductor device 201, the patterns 31 and 32 on which the plurality of MOSFET chips 5 are mounted and the patterns 33 and 34 on which the plurality of SBD chips 6 are mounted are provided on the different insulating substrates 21 and 22, respectively. Accordingly, thermal interference between the plurality of MOSFET chips 5 and the plurality of SBD chips 6 can be suppressed as compared with the configuration of Embodiment 1. Therefore, a difference in the values of thermal resistances is further reduced between the case where the thermal resistances are measured under the actual use where the plurality of MOSFET chips 5 and the plurality of SBD chips 6 generate heat under respective operating conditions and the case where the thermal resistances are measured for individual chips, making thermal design further facilitated.

As illustrated in FIG. 7, the insulating substrate 21 and the insulating substrate 22 desirably have substantially the same shape. As a result, this makes the heat capacity from each MOSFET chip 5 to the base plate 1 and the heat capacity from each SBD chip 6 to the base plate 1 almost equal, making the design using the transient thermal resistance facilitated.

<B-3. Modification

Figure 8:
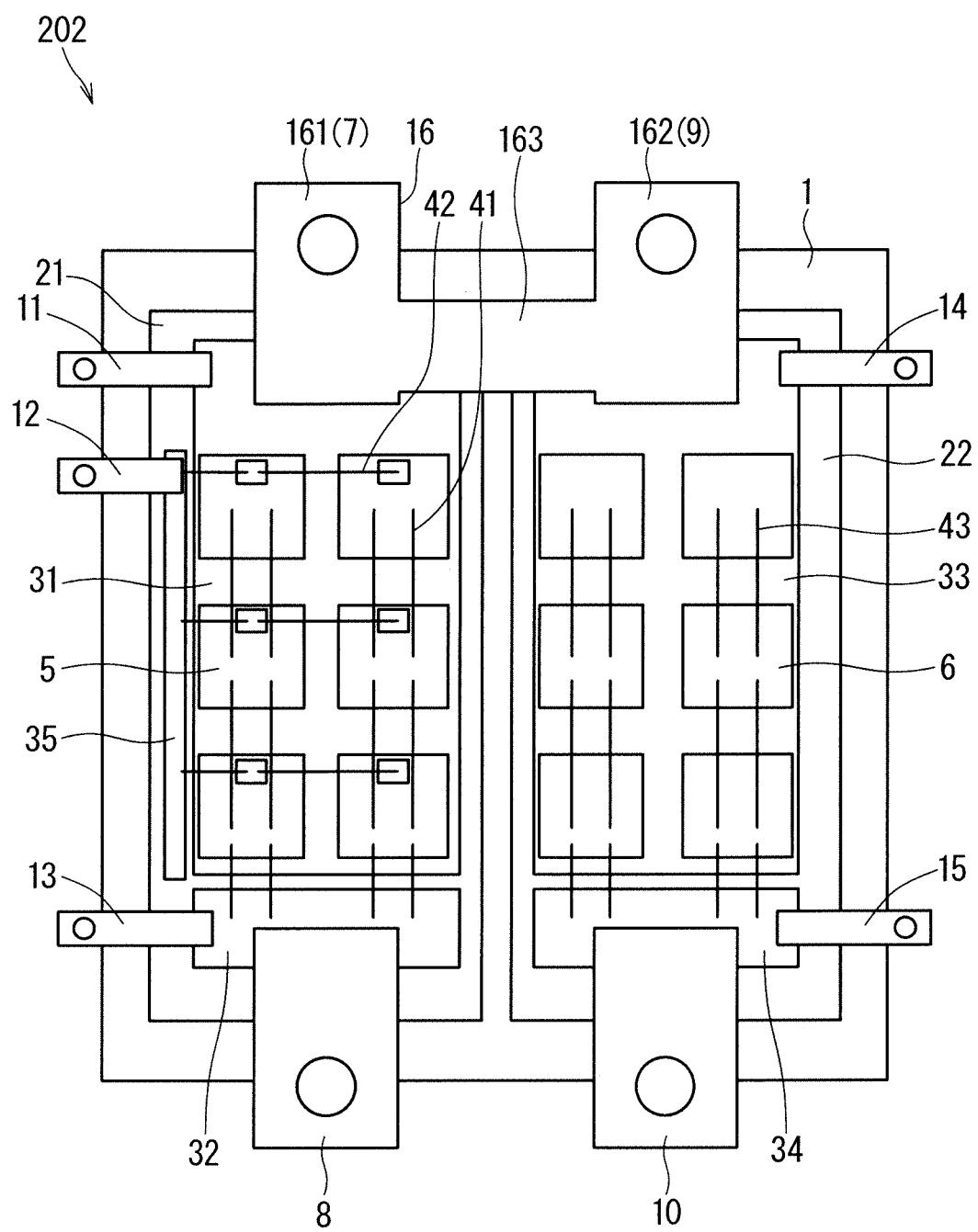
FIG. 8 is a plan view of a semiconductor device of Modification 1 of Embodiment 2.

FIG. 8 is a plan view of a semiconductor device 202 of Modification 1 of Embodiment 2. Modification 1 of Embodiment 2 is a modification in which Modification 1 of Embodiment 1 is applied to Embodiment 2. In the semiconductor device 202, the drain main terminal 7 and the cathode main terminal 9 are connected by being configured by the common terminal 16, and other than that, the semiconductor device 202 is the same as the semiconductor device 201. An equivalent circuit diagram of the semiconductor device 202 is the same as the equivalent circuit diagram of the semiconductor device 102 illustrated in FIG. 4.

Figure 9:
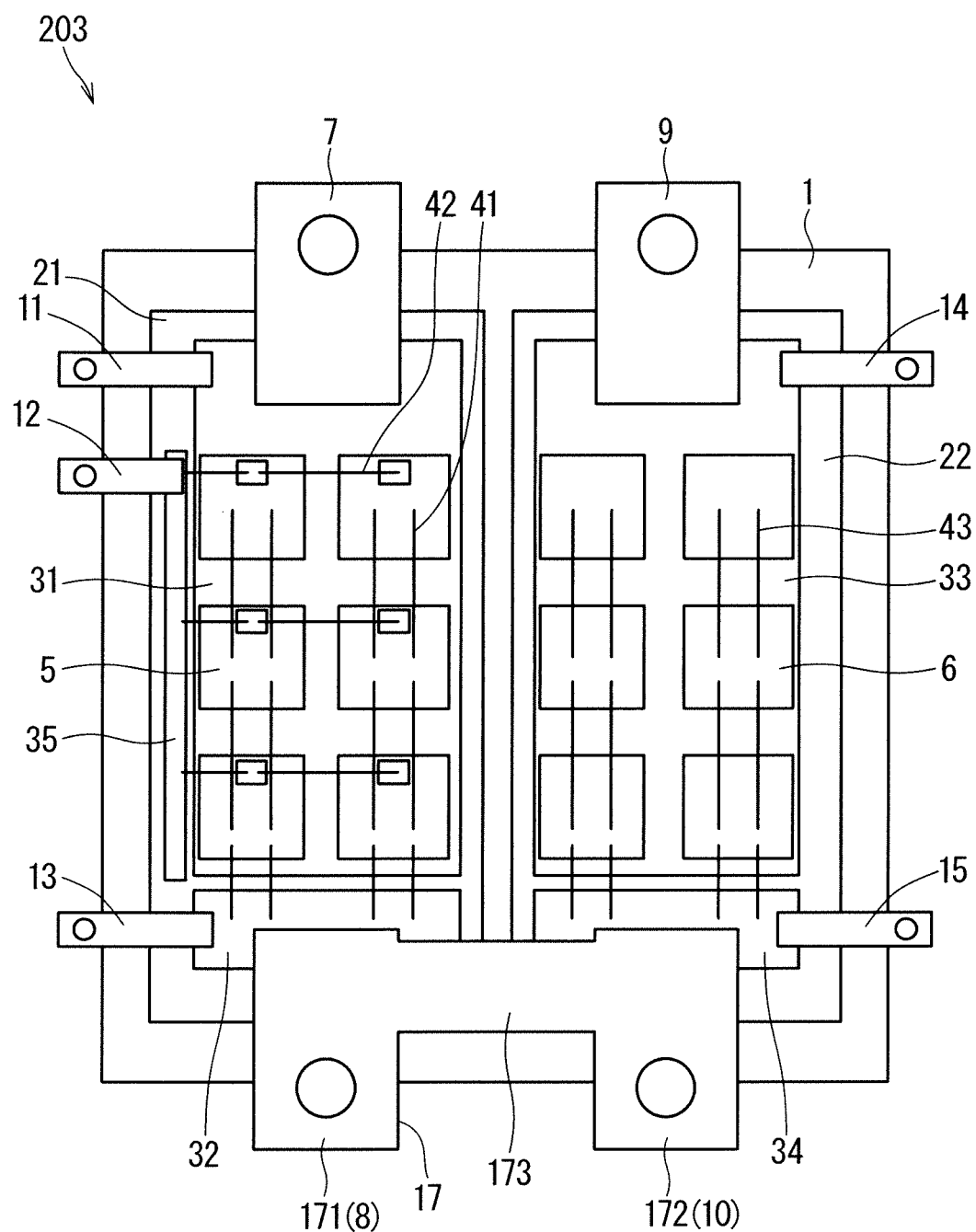
FIG. 9 is a plan view of a semiconductor device of Modification 2 of Embodiment 2.

FIG. 9 is a plan view of a semiconductor device 202 of Modification 2 of Embodiment 2. Modification 2 of Embodiment 2 is a modification in which Modification 2 of Embodiment 1 is applied to Embodiment 2. In the semiconductor device 203, the source main terminal 8 and the anode main terminal 10 are connected by being configured by the common terminal 17, and other than that, the semiconductor device 203 is the same as the semiconductor device 201. An equivalent circuit diagram of the semiconductor device 203 is the same as the equivalent circuit diagram of the semiconductor device 103 illustrated in FIG. 6.

C. Embodiment 3

<C-1. Configuration>

Figure 10:
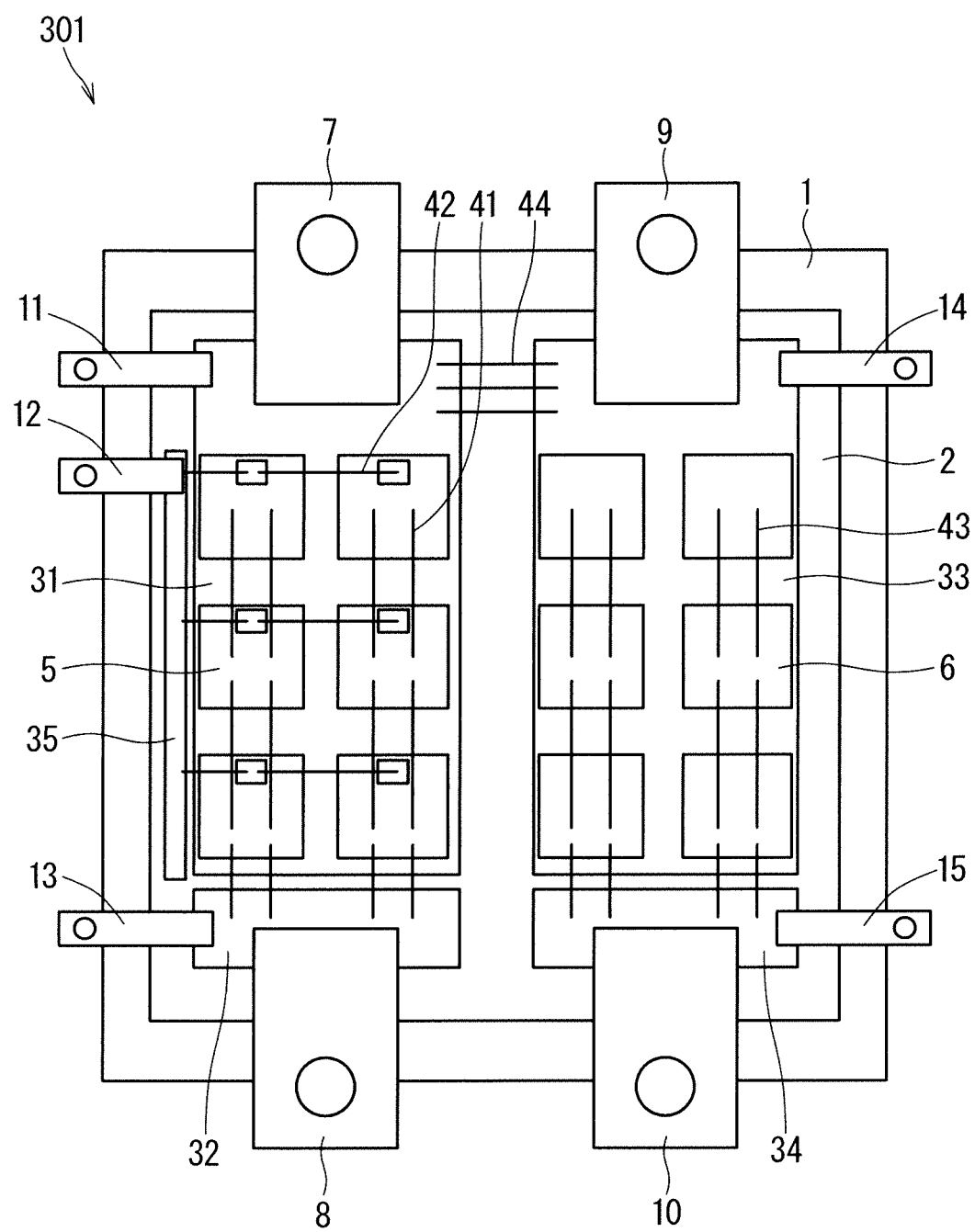
FIG. 10 is a plan view of a semiconductor device of Embodiment 3.

FIG. 10 is a plan view of a semiconductor device 301 of Embodiment 3. In Modification 1 of Embodiment 1, the drain main terminal 7 and the cathode main terminal 9 are connected by being configured by the common terminal 16. Instead of this, in the semiconductor device 301, the pattern 31 being the drain conductive pattern and the pattern 33 being the cathode conductive pattern 33 are connected by conductive wires 44, so that the drain main terminal 7 and the cathode main terminal 9 are electrically connected. The configuration of semiconductor device 301 other than the above is the same as the semiconductor device 101 of Embodiment 1. An equivalent circuit diagram of the semiconductor device 301 is the same as the equivalent circuit diagram of the semiconductor device 102 illustrated in FIG. 4.

<C-2. Effects>

In the semiconductor device 301 of Embodiment 3, the pattern 31 being the drain conductive pattern and the pattern 33 being the cathode conductive pattern are connected by the conductive wires 44, so that the drain main terminal 7 and the cathode main terminal 9 are electrically connected. Therefore, the thermal interference between the plurality of MOSFET chips 5 and the plurality of SBD chips 6 is suppressed, compared with Modification 1 of Embodiment 1 in which the drain main terminal 7 and the cathode main terminal 9 are connected by being configured by the common terminal 16, As a result, a difference in the values of thermal resistances between the case where the thermal resistances are measured under the actual use where the plurality of MOSFET chips 5 and the plurality of SBD chips 6 generate heat under respective operating conditions and the case where the thermal resistances are measured for individual chips is reduced further than that in Modification 1 of Embodiment 1, making thermal design facilitated.

<C-3. Modification>

Figure 11:
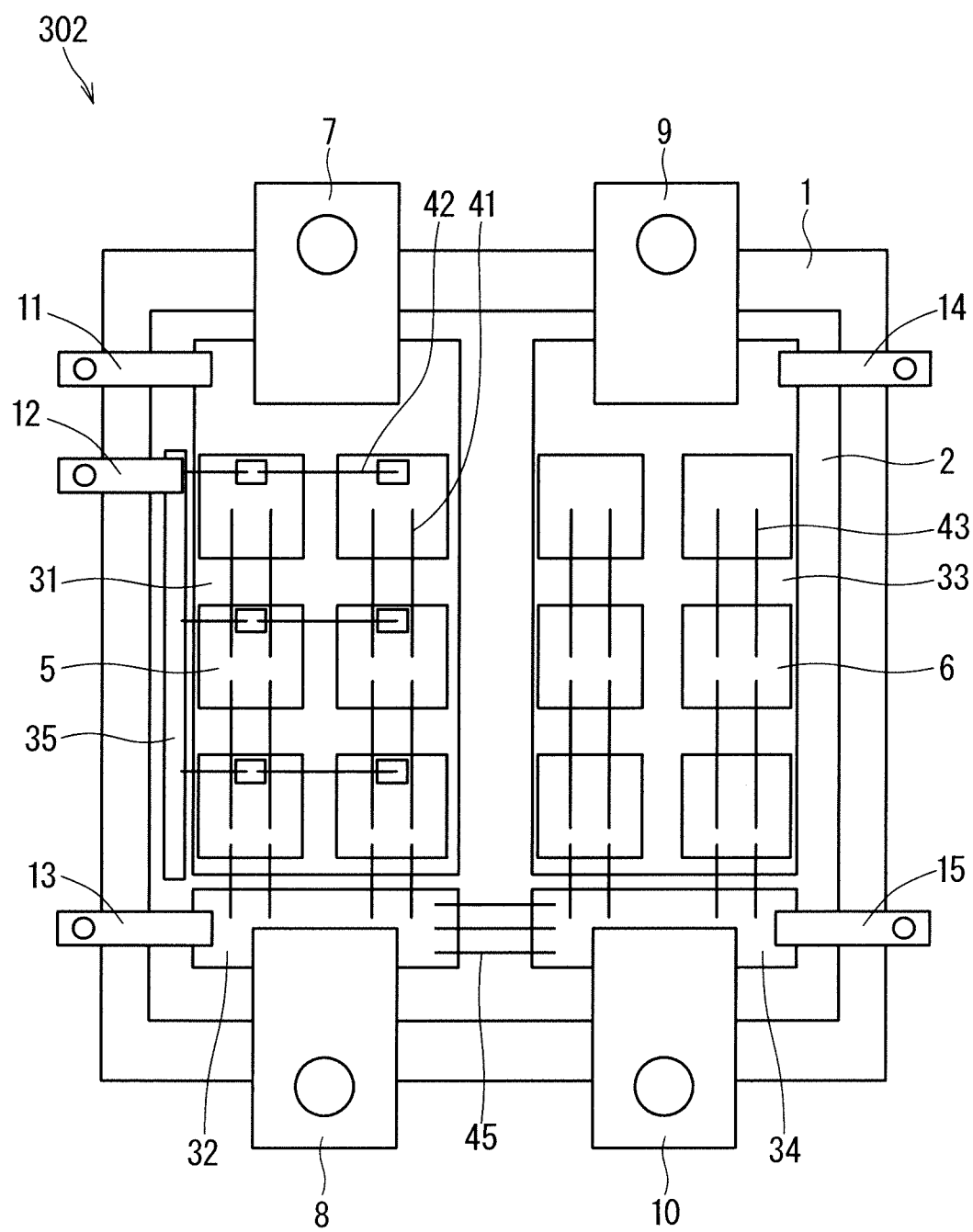
FIG. 11 is a plan view of a semiconductor device of Modification 1 of Embodiment 3.

FIG. 11 is a plan view of a semiconductor device 302 of Modification 1 of Embodiment 3. Modification 1 of Embodiment 3 is a modification in which Modification 2 of Embodiment 1 is applied to Embodiment 3. In the semiconductor device 302, the pattern 32 being the source conductive pattern and the pattern 34 being the anode conductive pattern are connected by conductive wires 45, so that the source main terminal 8 and the anode main terminal 10 are electrically connected. The configuration of semiconductor device 302 other than the above is the same as the semiconductor device 101 of Embodiment 1. An equivalent circuit diagram of the semiconductor device 302 is the same as the equivalent circuit diagram of the semiconductor device 103 illustrated in FIG. 6.

Figure 12:
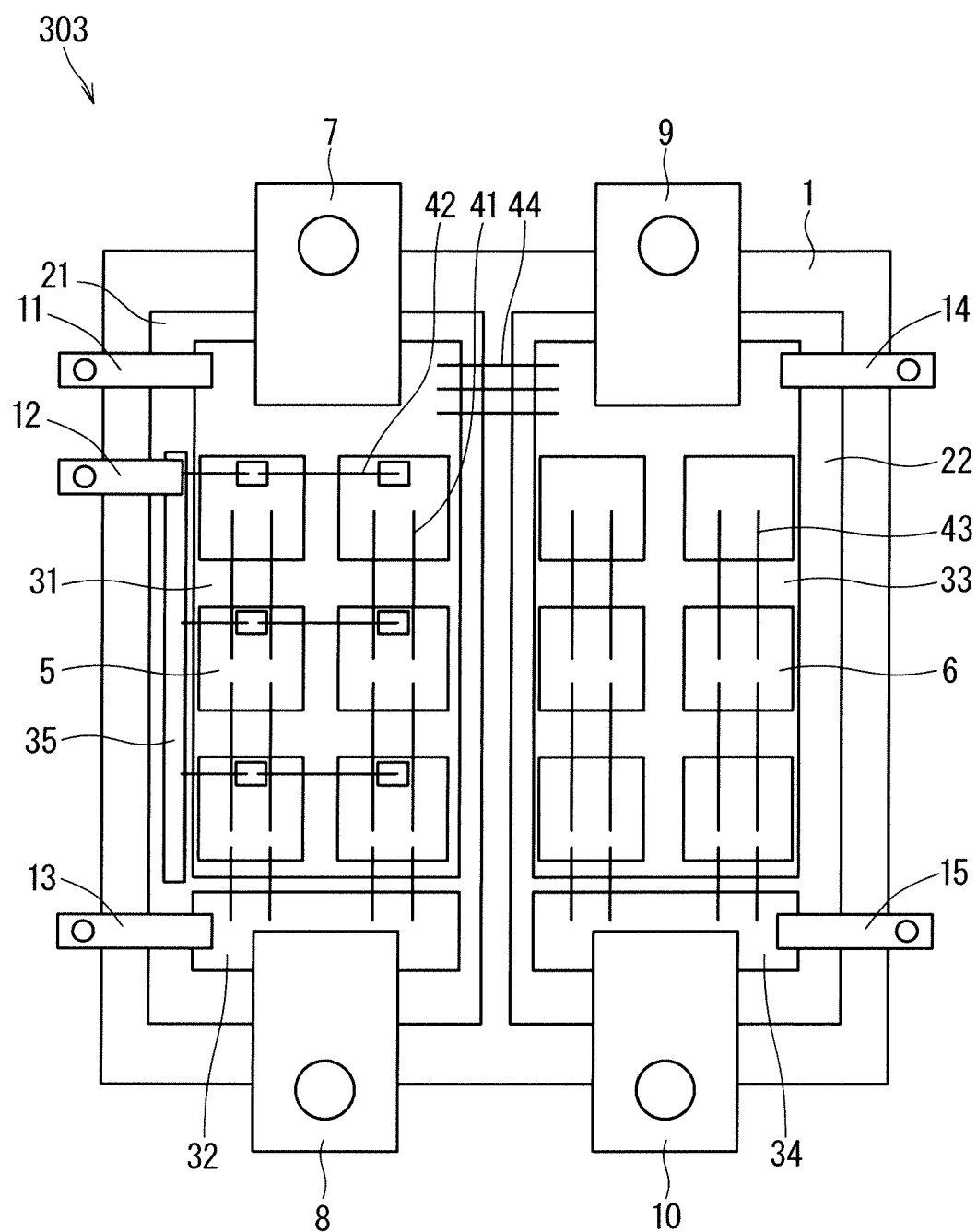
FIG. 12 is a plan view of a semiconductor device of Modification 2 of Embodiment 3.

FIG. 12 is a plan view of a semiconductor device 303 of Modification 2 of Embodiment 3. Modification 2 of Embodiment 3 is a modification in which Modification 1 of Embodiment 2 is applied to Embodiment 3. In the semiconductor device 303, the pattern 31 being the drain conductive pattern and the pattern 33 being the cathode conductive pattern are connected by the conductive wires 44, so that the source main terminal 8 of each MOSFET chip 5 and the anode main terminal 10 of each SBD chip 6 are electrically connected. The configuration of semiconductor device 303 other than the above is the same as the semiconductor device 201 of Embodiment 2. An equivalent circuit diagram of the semiconductor device 303 is the same as the equivalent circuit diagram of the semiconductor device 102 illustrated in FIG. 4.

Figure 13:
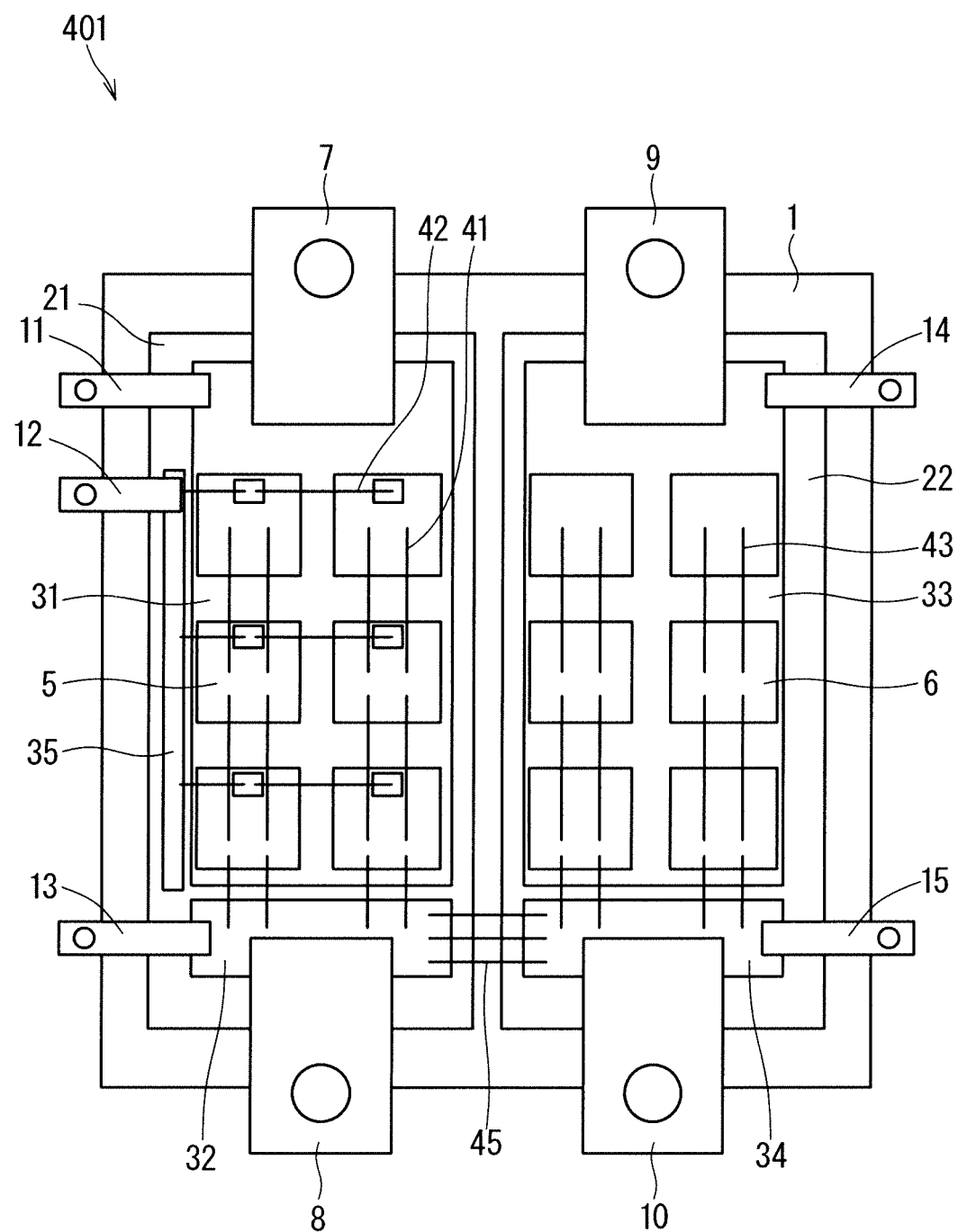
FIG. 13 is a plan view of a semiconductor device of Modification 3 of Embodiment 3.

FIG. 13 is a plan view of a semiconductor device 304 of Modification 3 of Embodiment 3. Modification 3 of Embodiment 3 is a modification in which Modification 2 of Embodiment 2 is applied to Embodiment 3. In the semiconductor device 304, the pattern 32 being the source conductive pattern and the pattern 34 being the anode conductive pattern are connected by the conductive wires 45, so that the source main terminal 8 of each MOSFET chip 5 and the anode main terminal 10 of each SBD chip 6 are electrically connected. The configuration of semiconductor device 304 other than the above is the same as the semiconductor device 201 of Embodiment 2. An equivalent circuit diagram of the semiconductor device 304 is the same as the equivalent circuit diagram of the semiconductor device 103 illustrated in FIG. 6.

D. Embodiment 4

<D-1. Configuration>

Figure 14:
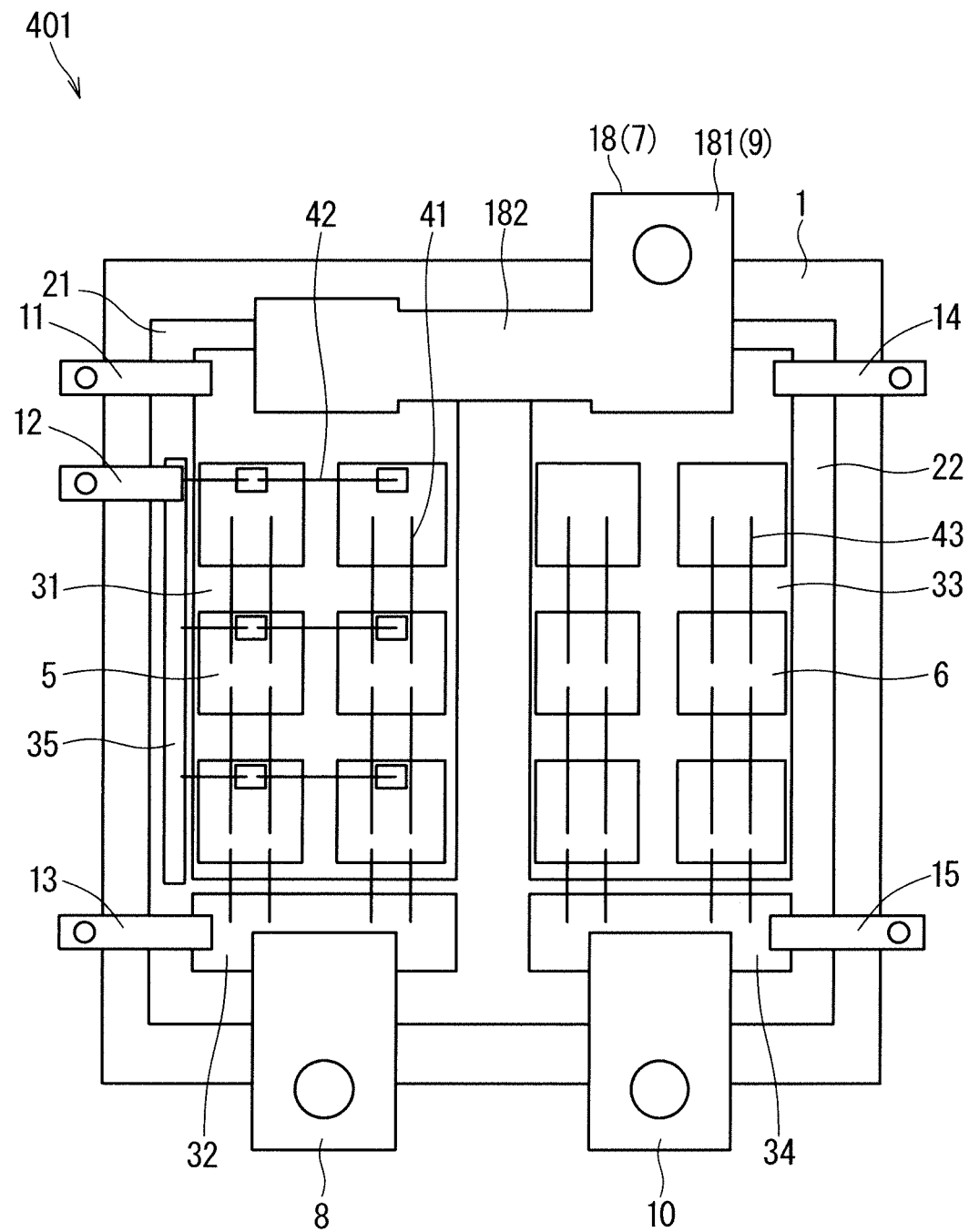
FIG. 14 is a plan view of a semiconductor device of Embodiment 4.

FIG. 14 is a plan view of a semiconductor device 401 of Embodiment 4. The semiconductor device 401 is different from the semiconductor device 102 of the Modification 1 of Embodiment 1 only in that a common terminal 18 is provided instead of the common terminal 16. Like the common terminal 16, the common terminal 18 is also referred to as a first common terminal.

The common terminal 18 includes a first member 181 drawn linearly from the pattern 33 being the cathode conductive pattern in a direction perpendicular to an end edge of the base plate 1, and a second member 182 connecting the pattern 31 being the drain conductive pattern and the first member 181. The first member 181 is a current path from the external configuration of the semiconductor device connected to the common terminal 18 to the pattern 33, and constitutes the drain main terminal 9. Further, the portion from the external configuration of the semiconductor device connected to the common terminal 18 to the connection portion of the first member 181 with the second member 182 and the entire second member 182 configure a current path reaching from the external configuration to the pattern 31 which constitutes the drain main terminal 7. In other words, the common terminal 18 is connected to both the pattern 31 and the pattern 33, and is drawn out biased toward the pattern 33 side being the cathode conductive pattern.

<D-2. Effects>

The drain main terminal 7 is longer than the cathode main terminal 9 due to the shape of the common terminal 18 described above; therefore, the wiring inductance of the drain main terminal 7 is greater than the wiring inductance of the cathode main terminal 9. As a result, when the SBD chips 6 are energized, the phenomenon that the body diode 52 of the MOSFET 51 is turned on by the induced electromotive force generated by the wiring inductance of the SBD chips 6 side, that is, the cathode main terminal 9 can be prevented.

<D-3. Modification>

Figure 15:
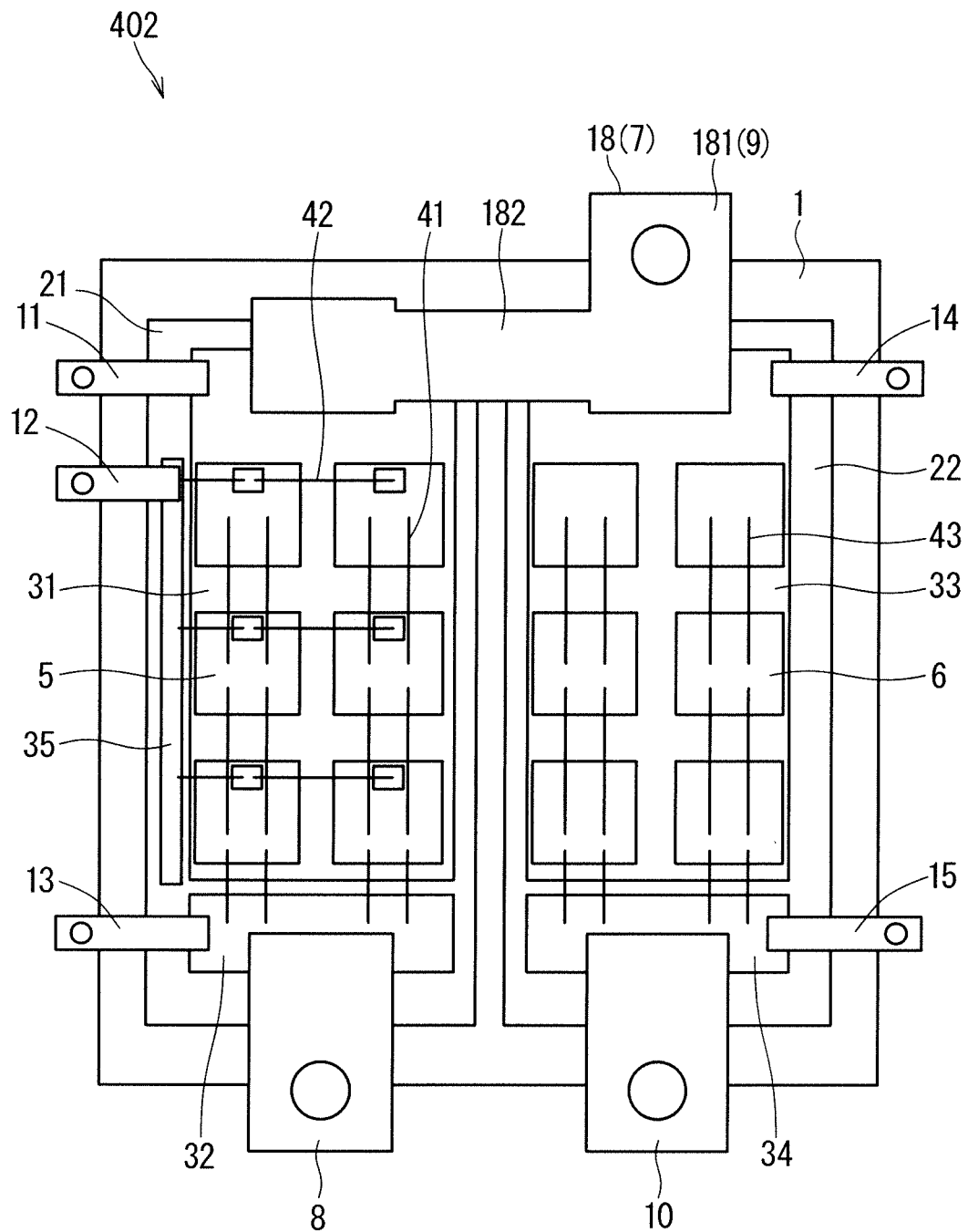
FIG. 15 is a plan view of a semiconductor device of Modification 1 of Embodiment 4.

FIG. 15 is a plan view of a semiconductor device 402 of Modification 1 of Embodiment 4. Modification 1 of Embodiment 4 is a modification in which Modification 1 of Embodiment 2 is applied to Embodiment 4. The semiconductor device 402 is different from the semiconductor device 202 of the Modification 1 of Embodiment 2 only in that a common terminal 18 is provided instead of the common terminal 16.

Figure 16:
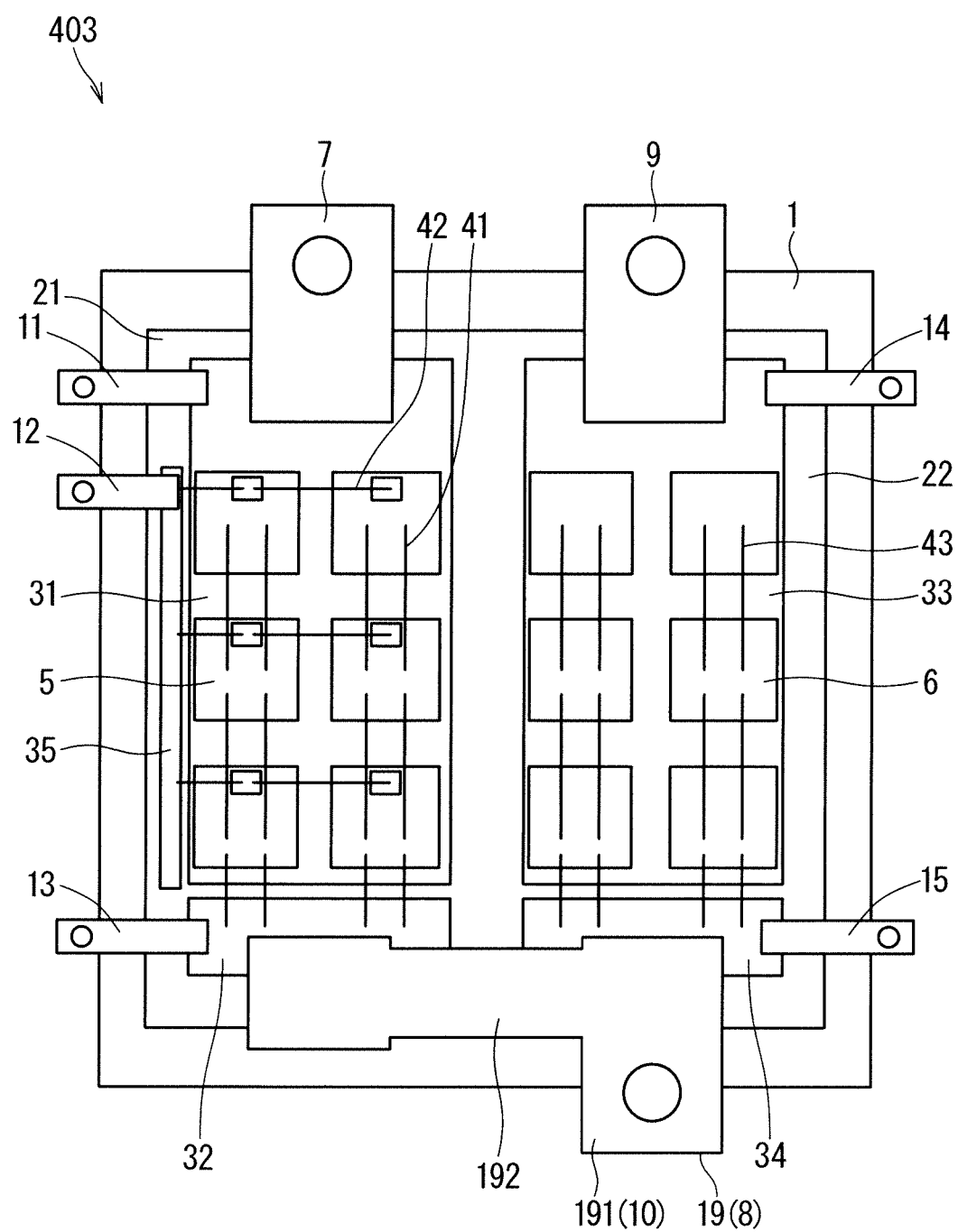
FIG. 16 is a plan view of a semiconductor device of Modification 2 of Embodiment 4.

FIG. 16 is a plan view of a semiconductor device 403 of Modification 2 of Embodiment 4. Modification 2 of Embodiment 4 is a modification in which Modification 2 of Embodiment 1 is applied to Embodiment 4. The semiconductor device 403 is different from the semiconductor device 103 of the Modification 2 of Embodiment 1 only in that a common terminal 19 is provided instead of the common terminal 17. Like the common terminal 17, the common terminal 19 is also referred to as a second common terminal. The common terminal 19 includes a first member 191 drawn linearly from the pattern 34 being the anode conductive pattern in a direction perpendicular to an end edge of the base plate 1, and a second member 192 connecting the pattern 32 being the source conductive pattern and the first member 191. The first member 191 is a current path from the external configuration of the semiconductor device connected to the common terminal 19 to the pattern 34, and constitutes the anode main terminal 10. Further, the portion from the external configuration of the semiconductor device connected to the common terminal 19 to the connection portion of the first member 191 with the second member 192 and the entire second member 192 configure a current path reaching from the external configuration to the pattern 32 which constitutes the drain main terminal 8. In other words, the common terminal 19 is connected to both the pattern 32 and the pattern 34, and is drawn out biased toward the pattern 34 side being the anode conductive pattern.

The source main terminal 8 is longer than the anode main terminal 10 due to the shape of the common terminal 19 described above, so that the wiring inductance of the source main terminal 8 is greater than the wiring inductance of the anode main terminal 10. As a result, when the SBD chips 6 are energized, the phenomenon that the body diode 52 of the MOSFET 51 is turned on by the induced electromotive force generated by the wiring inductance of the SBD chips 6 side, that is, the anode main terminal 10 can be prevented.

Figure 17:
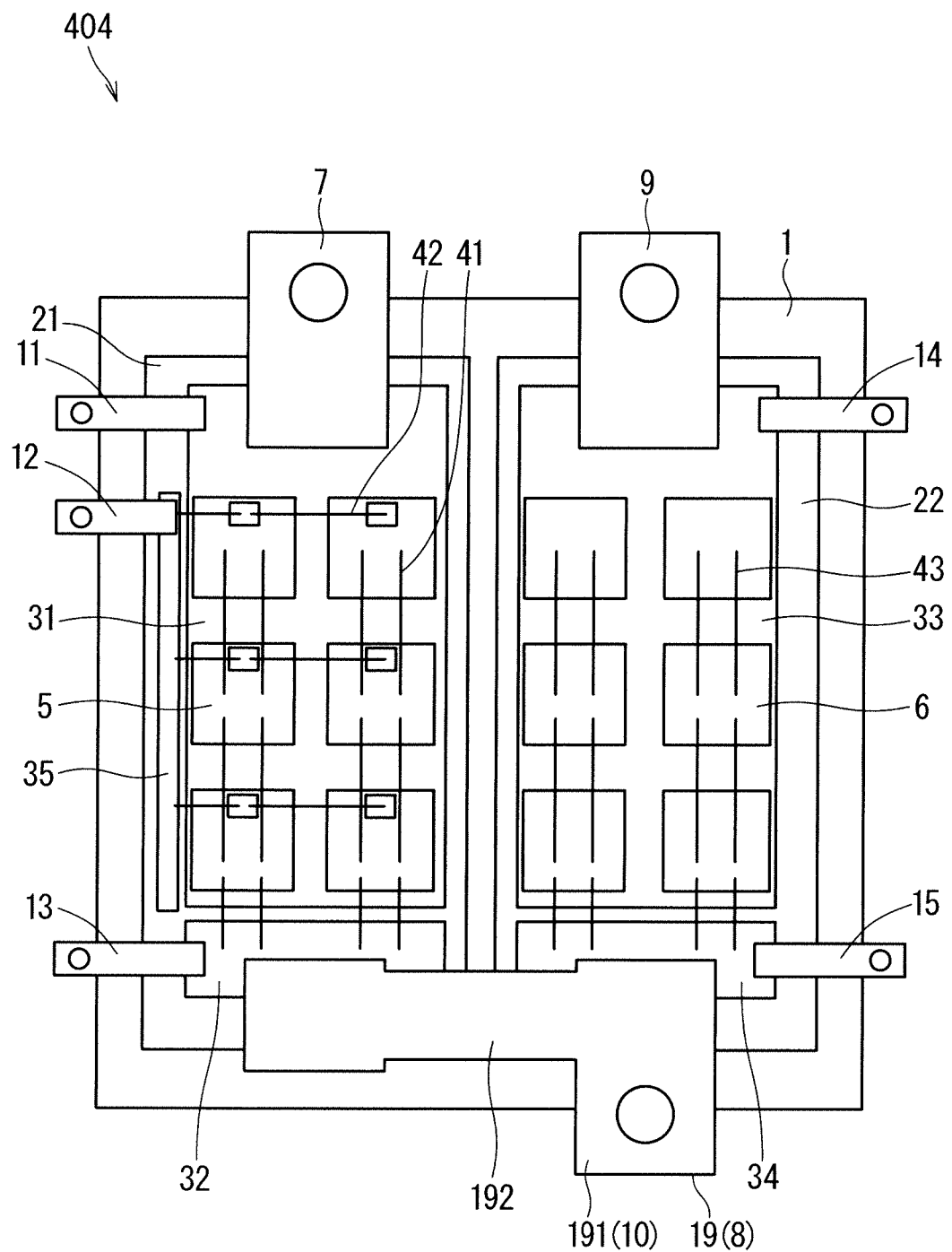
FIG. 17 is a plan view of a semiconductor device of Modification 3 of Embodiment 4.

FIG. 17 is a plan view of a semiconductor device 404 of Modification 3 of Embodiment 4. Modification 4 of Embodiment 3 is a modification in which Modification 2 of Embodiment 2 is applied to Embodiment 4. The semiconductor device 404 is different from the semiconductor device 203 of the Modification 2 of Embodiment 2 only in that the common terminal 19 is provided instead of the common terminal 17.

The shapes of the common terminals 18 and 19 described above are examples. The common terminals 18 and 19 need only have a shape such that the wiring inductance on the MOSFET chips 5 side is greater than the wiring inductance on the SBD chips 6 side. Specifically, the common terminal 18 need only have a shape such that the wiring inductance of the drain main terminal 7 is greater than the wiring inductance of the cathode main terminal 9. Then, the common terminal 19 need only have a shape such that the wiring inductance of the source main terminal 8 is greater than the wiring inductance of the anode main terminal 10.

The configuration of Embodiment 3 may be combined with that of Embodiment 4. That is, the drain main terminal 7 and the cathode main terminal 9 may be provided separately, and the patterns 31 and 33 may be connected by the conductive wires 44. In this case, the shapes of the drain main terminal 7 and the cathode main terminal 9 are designed so that the wiring inductance of the drain main terminal 7 is greater than the wiring inductance of the cathode main terminal 9. That is, the source main terminal 8 and the anode main terminal 10 may be provided separately, and the patterns 32 and 34 may be connected by the conductive wires 45. In this case, the shapes of the source main terminal 8 and the anode main terminal 10 are designed so that the wiring inductance of the source main terminal 8 is greater than the wiring inductance of the anode main terminal 10.

The Embodiments can be arbitrarily combined, appropriately modified or omitted.

While the disclosure has been illustrated and described in detail, the foregoing description is in all aspects illustrative and not restrictive. It is therefore understood that numerous modifications and variations can be devised without departing from the scope of the invention.

What is claimed is:

1. A semiconductor device comprising:
   a base plate;
   at least one insulating substrate provided on the base plate;
   a first pattern, a second pattern, a third pattern, and a fourth pattern being conductive patterns provided apart from each other on the at least one insulating substrate;
   a MOSFET chip provided on the first pattern, whose drain electrode and source electrode are electrically connected to the first pattern and the second pattern, respectively;
   an SBD chip provided on the third pattern, whose cathode electrode and anode electrode are electrically connected to the third pattern and the fourth pattern, respectively;
   a drain terminal connected to the first pattern;
   a source terminal connected to the second pattern;
   a cathode terminal connected to the third pattern; and
   an anode terminal connected to the fourth pattern, wherein
   at least one of between the drain terminal and the cathode terminal and between the source terminal and the anode terminal is not electrically connected to each other, and
   at least one of the following:
   the drain terminal and the source terminal extend past opposite ends of the at least one insulating substrate, and
   the cathode terminal and the anode terminal extend past opposite ends of the at least one insulating substrate.

2. The semiconductor device according to claim 1, wherein
   the drain terminal and the cathode terminal are electrically connected to each other.

3. The semiconductor device according to claim 2, further comprising
   a first common terminal connected to the first pattern and the third pattern, wherein
   a current path from an external connection end of the first common terminal to the first pattern constitutes the drain terminal, and
   a current path from the external connection end of the first common terminal to the third pattern constitutes the cathode terminal.

4. The semiconductor device according to claim 3, wherein
   a wiring inductance of the drain terminal is greater than a wiring inductance of the cathode terminal.

5. The semiconductor device according to claim 2, wherein
the first pattern and the third pattern are connected to each other by conductive wires.

6. The semiconductor device according to claim 1, wherein
the source terminal and the anode terminal are electrically connected to each other.

7. The semiconductor device according to claim 6, further comprising
a second common terminal connected to the second pattern and the fourth pattern, wherein
a current path from an external connection end of the second common terminal to the second pattern constitutes the source terminal, and
a current path from the external connection end of the second common terminal to the fourth pattern constitutes the anode terminal.

8. The semiconductor device according to claim 7, wherein
the second pattern and the fourth pattern are connected to each other by conductive wires.

9. The semiconductor device according to claim 7, wherein
a wiring inductance of the source terminal is greater than a wiring inductance of the anode terminal.

10. The semiconductor device according to claim 1, wherein
the at least one insulating substrate includes a first insulating substrate and a second insulating substrate,
the first pattern and the second pattern are provided on the first insulating substrate, and
the third pattern and the fourth pattern are provided on the second insulating substrate.

11. The semiconductor device according to claim 10, wherein
the first insulating substrate and the second insulating substrate are a same shape.

12. A semiconductor device comprising:
a base plate;
at least one insulating substrate provided on the base plate;
a first pattern, a second pattern, a third pattern, and a fourth pattern being conductive patterns provided apart from each other on the at least one insulating substrate;
a MOSFET chip provided on the first pattern, whose drain electrode and source electrode are electrically connected to the first pattern and the second pattern, respectively;
an SBD chip provided on the third pattern, whose cathode electrode and anode electrode are electrically connected to the third pattern and the fourth pattern, respectively;
a drain terminal connected to the first pattern;
a source terminal connected to the second pattern;
a cathode terminal connected to the third pattern; and
an anode terminal connected to the fourth pattern, wherein
at least one of between the drain terminal and the cathode terminal and between the source terminal and the anode terminal is not electrically connected to each other,
the first pattern and the third pattern are a same shape, and
the second pattern and the fourth pattern are a same shape.

* * * * *